United States Patent
Yan et al.

(10) Patent No.: US 11,424,310 B2
(45) Date of Patent: Aug. 23, 2022

(54) DISPLAY PANEL HAVING ADJUSTING LAYER AND ELASTIC LAYER AND METHOD OF MANUFACTURING THE DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventors: Bo Yan, Hubei (CN); Jun Cao, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 220 days.

(21) Appl. No.: 16/614,298

(22) PCT Filed: Sep. 19, 2019

(86) PCT No.: PCT/CN2019/106635
§ 371 (c)(1),
(2) Date: Nov. 15, 2019

(87) PCT Pub. No.: WO2020/252956
PCT Pub. Date: Dec. 24, 2020

(65) Prior Publication Data
US 2021/0336213 A1 Oct. 28, 2021

(30) Foreign Application Priority Data
Jun. 20, 2019 (CN) .......................... 201910536157.9

(51) Int. Cl.
*H01L 27/32* (2006.01)
*H01L 51/52* (2006.01)
(Continued)

(52) U.S. Cl.
CPC ...... *H01L 27/3276* (2013.01); *H01L 27/3246* (2013.01); *H01L 27/3258* (2013.01);
(Continued)

(58) Field of Classification Search
CPC ... H01L 27/3276–3279; H01L 27/3297; H01L 27/3246; H01L 27/3283;
(Continued)

(56) References Cited

U.S. PATENT DOCUMENTS 10,254,574 B2 * 4/2019 Tokuda .................. H05B 33/04
11,139,454 B2 * 10/2021 Choi .................... H01L 51/0097
(Continued)

FOREIGN PATENT DOCUMENTS

CN 104241316 A 12/2014
CN 107123667 A 9/2017
(Continued)

*Primary Examiner* — Scott B Geyer

(57) ABSTRACT

A display panel having an adjusting layer and an elastic layer and a method of manufacturing the display panel are disclosed. Structures of stacked layers of a non-display region of the display panel are patterned. The patterned structures and a portion of an encapsulation layer form the adjusting layer. The adjusting layer makes a position of a neutral plane of a pad bending region approach to a position of a layer where a source/drain electrode is disposed.

12 Claims, 5 Drawing Sheets

(51) Int. Cl.
*H01L 51/56* (2006.01)
*H01L 51/00* (2006.01)

(52) U.S. Cl.
CPC .......... *H01L 51/5253* (2013.01); *H01L 51/56* (2013.01); *H01L 51/0097* (2013.01); *H01L 2227/323* (2013.01); *H01L 2251/5338* (2013.01)

(58) Field of Classification Search
CPC ............ H01L 27/3295; H01L 51/0097; H01L 2251/5338; H01L 27/3288; G09G 2380/02
See application file for complete search history.

(56) References Cited

U.S. PATENT DOCUMENTS

| | | | | |
|---|---|---|---|---|
| 2008/0054785 | A1* | 3/2008 | Hayashi | B29C 65/14 156/273.3 |
| 2015/0036299 | A1* | 2/2015 | Namkung | H01L 51/5253 361/749 |
| 2017/0358642 | A1* | 12/2017 | Jo | H01L 27/3276 |
| 2018/0006267 | A1* | 1/2018 | Sakamoto | H01L 27/3276 |
| 2018/0040672 | A1* | 2/2018 | Park | H01L 27/323 |
| 2018/0097199 | A1* | 4/2018 | Jo | H01L 51/5253 |
| 2018/0102399 | A1* | 4/2018 | Cho | H01L 27/3265 |
| 2018/0145125 | A1* | 5/2018 | Lee | H01L 27/3262 |
| 2018/0166019 | A1* | 6/2018 | Lee | H01L 51/5203 |
| 2018/0173277 | A1* | 6/2018 | Lee | H01L 27/3276 |
| 2019/0019966 | A1* | 1/2019 | Jiang | H01L 51/0097 |
| 2019/0035869 | A1* | 1/2019 | Kim | H01L 27/3276 |
| 2019/0074459 | A1* | 3/2019 | Kim | H01L 51/5256 |
| 2019/0157312 | A1 | 5/2019 | Lee et al. | |
| 2019/0157607 | A1* | 5/2019 | Kim | H01L 51/5237 |
| 2019/0164995 | A1* | 5/2019 | Lee | H01L 27/3276 |
| 2019/0280075 | A1* | 9/2019 | Chung | H01L 51/5256 |
| 2019/0319201 | A1* | 10/2019 | Goh | H01L 27/3276 |
| 2019/0326360 | A1* | 10/2019 | Gwon | G06F 3/0443 |
| 2020/0091446 | A1* | 3/2020 | Seo | H01L 27/3276 |
| 2020/0105168 | A1* | 4/2020 | Choi | H01L 51/5253 |
| 2020/0127229 | A1* | 4/2020 | Noh | H01L 51/5237 |
| 2020/0150725 | A1* | 5/2020 | Saitoh | H01L 51/0097 |
| 2020/0243778 | A1* | 7/2020 | Li | H01L 27/3276 |

FOREIGN PATENT DOCUMENTS

| | | |
|---|---|---|
| CN | 107706220 A | 2/2018 |
| CN | 207664046 U | 7/2018 |
| CN | 109585514 A | 4/2019 |
| GN | 109461832 A | 3/2019 |
| GN | 109863019 A | 6/2019 |
| GN | 110197845 A | 9/2019 |

\* cited by examiner

DISPLAY PANEL HAVING ADJUSTING LAYER AND ELASTIC LAYER AND METHOD OF MANUFACTURING THE DISPLAY PANEL

FIELD OF INVENTION

The present invention relates to a field of display and, more particularly, to a display panel and a method of manufacturing same.

BACKGROUND OF INVENTION

Organic light-emitting diodes (OLEDs) are exceptional in terms of structure, response times, self-illumination, power consumption, and alike, and are widely used in display devices such as mobile phones, flat panels, and televisions. With development of product differentiation, flexible and foldable panels have become mainstream.

A flexible OLED display panel typically includes a display region, a driver integrated circuit (IC) disposed on a non-display region, and a plurality of metal wires connecting the driver IC with the display region. The driver IC is arranged at a bottom peripheral frame of the flexible OLED display panel. Generally, in practical applications, the driver IC is moved to a backside of the flexible OLED display panel by bending a portion of the flexible OLED display panel, and the portion of the flexible OLED display panel is called "pad bending region".

The pad bending region typically includes a flexible substrate, an organic filling layer, a plurality of metal wires, a planarization layer (PLN), a pixel defining layer (PDL), and a plurality of photo spacers (PSs). However, in a bending process, the metal wires of the pad bending region are prone to breakage by bending forces between layers due to different bending radii of the layers, thereby reducing reliability of an OLED device.

To sum up, a non-display region of a conventional OLED display panel is prone to damage by bending forces during a bending process. Therefore, it is necessary to fix the above technical defect.

SUMMARY OF INVENTION

The present invention provides a display panel. Structures of stacked layers of a non-display region of the display panel are patterned. The patterned structures and a portion of an encapsulation layer form an adjusting layer. The adjusting layer makes a position of a neutral plane of a pad bending region approach to a position of a layer on which a source/drain electrode is disposed, thereby alleviating an impact of bending forces on the metal wires. As a result, the technical defect that a non-display region of a conventional OLED display panel is prone to damage by bending forces during a bending process is improved.

To solve the above problem, technical solutions provided by the present invention are described as follows:

The present provides a display panel including a display region and a non-display region. A sub-bending region for bending is defined in the non-display region, an adjusting layer and an elastic layer for adjusting a position of a neutral plane of the sub-bending region are disposed on the sub-bending region, and the adjusting layer and the elastic layer are disposed oppositely on two sides of a metal wiring layer of the sub-bending region. The neutral plane of the sub-bending region in a bent state can approach to a metal wire of the sub-bending region by adjusting elastic moduli and thicknesses of the adjusting layer and the elastic layer.

According to a preferred embodiment of the present invention, the adjusting layer includes a dike structure and an elastic material layer formed in the dike structure.

According to a preferred embodiment of the present invention, material of the dike structure is at least one selected from the group consisting of material of a planarization layer, material of a pixel defining layer, and material of photo spacer layer. Material of the elastic material layer is an organic material of an organic encapsulation layer.

According to a preferred embodiment of the present invention, a dike region of the dike structure is aligned to an edge of the sub-bending region, and the elastic material layer is aligned to the edge of the sub-bending region, or a dike region of the dike structure is greater than the sub-bending region, and an area of a location covered by the elastic material layer is greater than an area of the sub-bending region.

According to a preferred embodiment of the present invention, the dike structure includes at least two sub-dike structures. Two adjacent sub-dike structures are connected to each other, and each of the two adjacent sub-dike structures includes a corresponding sub-elastic material layer.

According to a preferred embodiment of the present invention, thicknesses of the sub-elastic material layers formed in the two adjacent sub-dike structures are the same, and elastic moduli of the sub-elastic material layers formed in the two adjacent sub-dike structures are the same.

According to a preferred embodiment of the present invention, the dike structure is a one-piece and single-layer structure.

According to a preferred embodiment of the present invention, the dike structure is a stacked and multi-layer structure.

According to the above goal of the present invention, a method of manufacturing a display panel is provided including a plurality of steps of: step 10: providing a flexible substrate, defining a first region on a surface of the flexible substrate, defining a second region on a side of the first region, defining a sub-bending region in the second region, forming a thin film transistor (TFT) device layer on the first region, wherein a source/drain electrode of the TFT device layer extends to the second region; step 20: forming a planarization layer on the flexible substrate, patterning the planarization layer located in the second region, and forming a base layer of a dike structure in the sub-bending region; step 30: forming a pixel defining layer on the flexible substrate, patterning the pixel defining layer located in the second region, and forming a stacked layer of the dike structure in the sub-bending region; step 40: forming an organic light-emitting diode (OLED) device layer and a first non-organic encapsulation layer on the first region; step 50: forming an organic material layer on a surface of the first non-organic encapsulation layer and in the dike structure, wherein the dike structure and the organic material layer form an adjusting layer for adjusting a position of a neutral plane of the sub-bending region; and step 60: forming a second non-organic encapsulation layer on the surface of the flexible substrate, wherein the second non-organic encapsulation layer at least covers the first non-organic region.

According to a preferred embodiment of the present invention, the step 30 further includes a step of: step 301: forming a photo spacer layer on the flexible substrate, patterning the photo spacer layer. The photo spacer layer forms a plurality of spacers on the pixel defining layer, and the photo spacer layer forms a plurality of raised layers on a surface of the stacked layer of the dike structure.

Compared to conventional technology, beneficial effects of a display panel provided by the present invention are described below: structures of stacked layers of a non-display region of the display panel are patterned. The patterned structures and a portion of an encapsulation layer form a dike structure. The dike structure is filled with an organic material layer with high elastic modulus, and the organic material layer covers a layer on which metal wires are disposed. By adjusting thicknesses and elastic moduli of the organic material layer and a layer on the other side of the metal wires, a neutral plane of a pad bending region can approach to the metal wires, thereby alleviating damage of the metal wires caused by bending forces,

DESCRIPTION OF DRAWINGS

The accompanying figures to be used in the description of embodiments of the present disclosure or prior art will be described in brief to more clearly illustrate the technical solutions of the embodiments or the prior art, Apparently, the accompanying figures described below are only part of the embodiments of the present disclosure, from which figures those skilled in the art can derive further figures without making any inventive efforts.

FIG. 1b is a schematic cross-section diagram taken along line A-A' of FIG. 1a.

DESCRIPTION OF PREFERRED EMBODIMENT

Figure 1A:
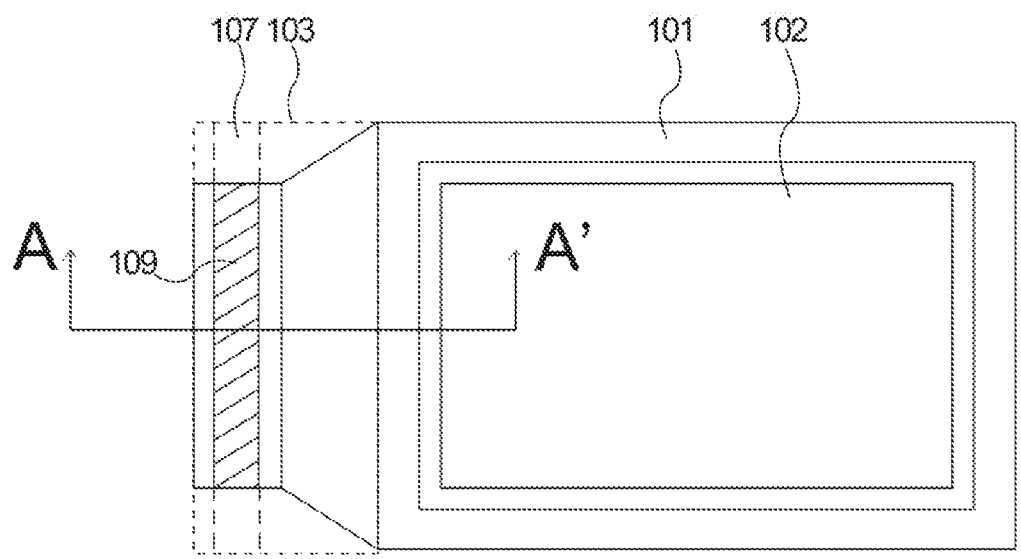
FIG. 1a is a schematic structural diagram showing a top view of a display panel provided by the present invention.

The following description of the various embodiments is provided with reference to the accompanying drawings. It should be understood that terms such as "upper," "lower," "front," "rear," "left," "right," "inside," "outside," "clockwise," "lateral" as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In the drawings, the identical or similar reference numerals constantly denote the identical or similar elements or elements having the identical or similar functions.

The present invention can improve a technical defect that a non-display region of a conventional OLED display panel is prone to damage by bending forces during a bending process.

Figure 1B:
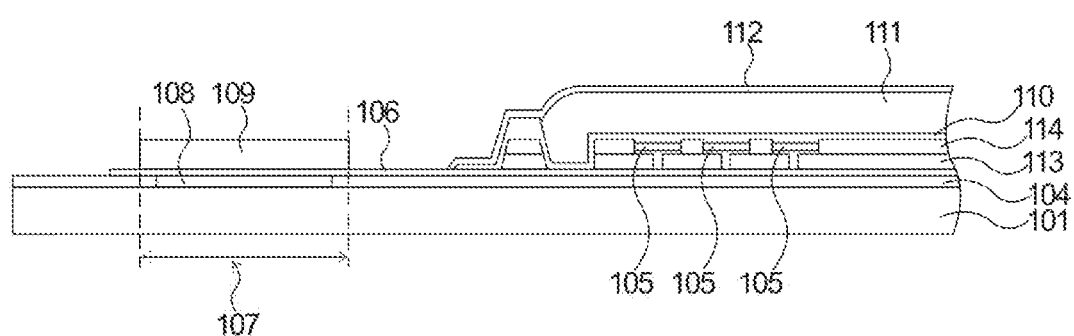

As shown in FIG. 1a and FIG. 1b, an embodiment of the present invention provides a display panel including a flexible substrate 101, a display region 102 defined on the flexible substrate 101, a non-display region defined on a side of the display region 102. The display region 102 includes a thin film transistor (TFT) device layer 104, an organic light-emitting diode (OLED) device 105, and an encapsulation layer. The encapsulation layer is a stacked layer including a first non-organic layer 110, an organic layer ill, and a second non-organic layer 112. The non-display region 103 includes a source/drain electrode wire 106 of a TFT device and an extending layer between the TFT device layer 104 and the OLED device 105. For example, the extending layer includes a planarization (PLN) layer 113, a pixel defining (PDL) layer 114 which are disposed on the TFT device, and a photo spacer (PS) layer disposed on a surface of the PDL layer 114. The PLN 113 is planarized to ensure that a pixel electrode and an OLED device can be disposed on a flat surface of a layer in a later process. The PDL layer 114 is configured to define a pixel defining region on the TFT device, and ensure a position of the OLED device. The PS layer is disposed on the PDL layer 114 and has a certain height. The PS layer is configured to prevent contact of masks used in deposition of organic light-emitting materials with a metal wire 106 disposed on a surface of the substrate 101, thereby avoiding mechanical damage of the metal wire 106.

The non-display region 103 includes an integrated chip (IC) and the metal wire 106 connecting the IC chip with the display region 102. The non-display region 103 is bent to a backside of the display panel to fix the IC chip on the backside of the display panel, A pad bending region is a sub-bending region 107 defined on the non-display region 103.

The sub-bending region 107 includes a substrate. The substrate includes the flexible substrate 101 and an elastic layer 108 disposed on the flexible substrate 101. Material of the elastic layer can be an organic material. The elastic layer 108 is embedded in the flexible substrate 101, and a top surface of the elastic layer 108 is aligned to a top surface of the flexible substrate 101. The sub-bending region 107 also includes the metal wire 106 disposed on the substrate and an adjusting layer 109 covering the metal wire 106. The adjusting layer 109 is made of an organic material layer with high elastic modulus. For instance, the adjusting layer 109 is made of material of an organic encapsulation layer of the display panel.

Figure 2A:
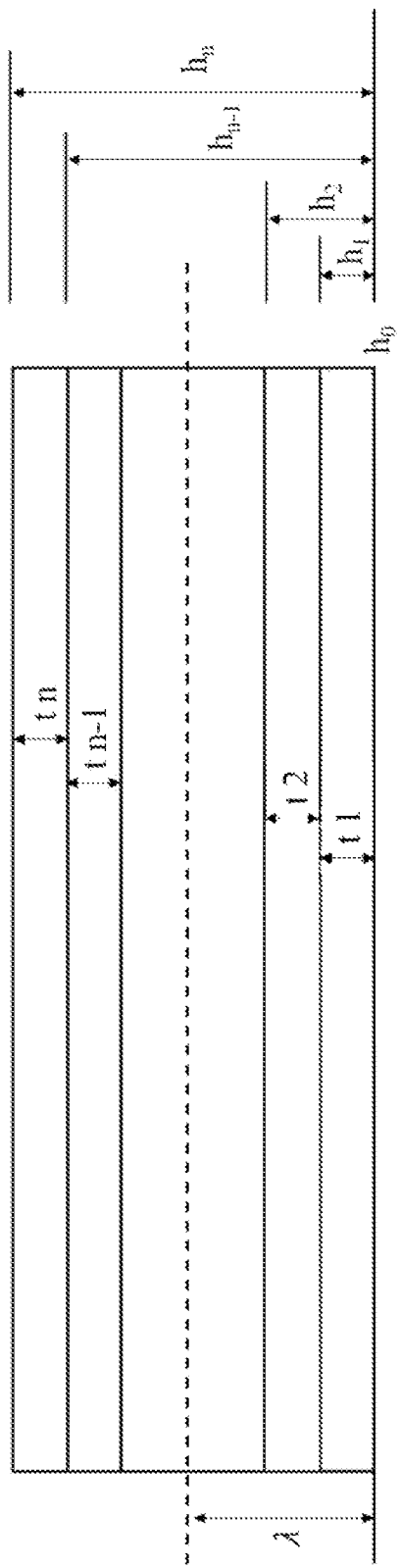
FIG. 2a and FIG. 2b are schematic diagrams showing an adjusting principle of a position of a neutral plane.

As shown in FIG. 2a, when a stacked structure is loaded by a bending force, an outer layer is in tension and an inner layer is in compression. There must be a plane, which is not under stress, either compression or tension, existing in the stacked structure, and the plane is a "neutral plane" of the stacked structure. A position of the neutral plane depends on a combination of thickness and elastic modulus of each layer of the stacked structure. An adjusting principle of the position of the neutral plane can be expressed by the following relation:
a distance (λ) from the position of the neutral plane to a bottom surface of the stacked structure can be calculated by the following equation:

$$\lambda = \frac{\sum_{1}^{n} E_i(h_i^2 - h_{i-1}^2)}{2\sum_{1}^{n} E_i t_i} \qquad 1.1$$

wherein $E_i$ is an elastic modulus at a i-th layer, $t_i$ is a thickness of the i-th layer, and $h_i$ is a distance from a top surface of the stacked structure to the bottom surface of the stacked structure.

Figure 2B:
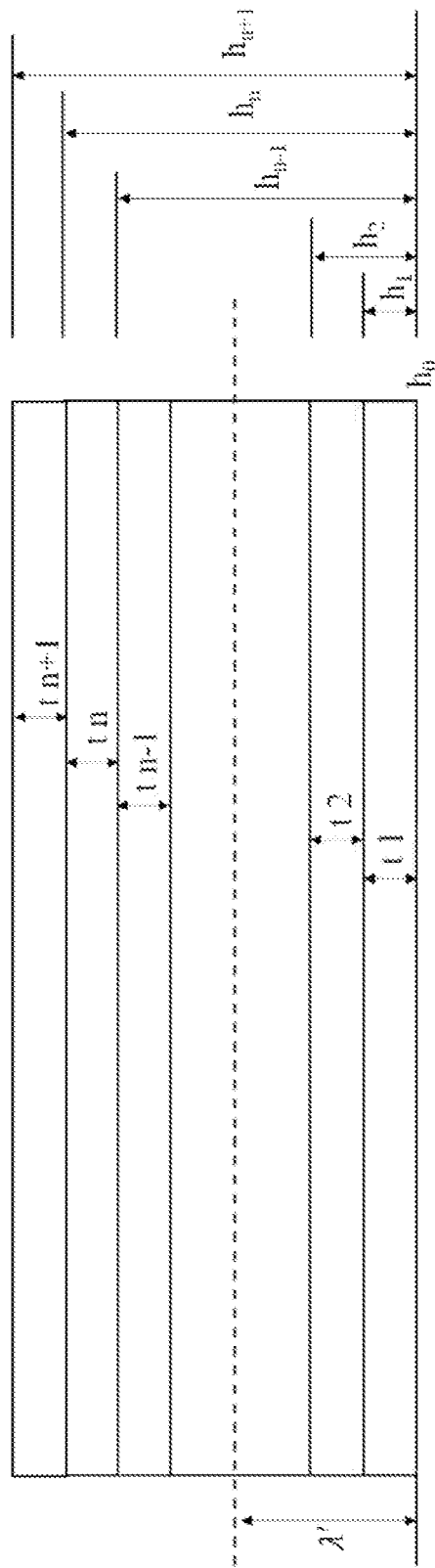

As shown in FIG. 2b, when a (i+1)-th layer is disposed on the stacked structure, a distance (λ') from the position of the neutral plane to the bottom surface of the stacked structure can be calculated by the following equation:

$$\lambda' = \frac{\sum_{1}^{n+1} E_i(h_i^2 - h_{i-1}^2)}{2\sum_{1}^{n+1} E_i t_i} \qquad 1.2$$

difference between λ' and λ:

$$\Delta\lambda = \lambda' - \lambda \qquad 1.3$$

in addition, $h_i$ and $t_i$ have the following relationship:

$$h_i = \Sigma_1^i t \qquad 1.4$$

by equation 1.1, 1.2, 1.3, and 1.4, we can solve:

$$\Delta\lambda = \frac{E_{n+1}t_{n+1}\left[\sum_{1}^{n}E_i t_i\left(\sum_{1}^{n}t_i + \sum_{1}^{n+1}t_i\right) - \sum_{1}^{n}E_i t_i\left(\sum_{1}^{i-1}t + \sum_{1}^{i}t\right)\right]}{2\sum_{1}^{n}E_i t_i \sum_{1}^{n+1}E_i t_i}$$

because $(\Sigma_1^n t_i + \Sigma_1^{n+1} t_i) > (\Sigma_1^{i-1} t + \Sigma_1^i t)$, $\Sigma_1^n E_i t_i (\Sigma_1^n t_i + \Sigma_1^{n+1} t_i) - \Sigma_1^n E_i t_i (\Sigma_1^{i-1} t + \Sigma_1^i t) \geq 0$ That is, Δλ>0, which means a position of the neutral plane moves upward.

In an embodiment of the present invention, before disposing the adjusting layer 109, the neutral plane is under the metal wire 106; after adding the adjusting layer 109, the neutral plane moves upward, and distance between the neutral plane and the metal wire 106 is reduced, which prevents damage of the metal wires caused by bending forces.

Figure 3:
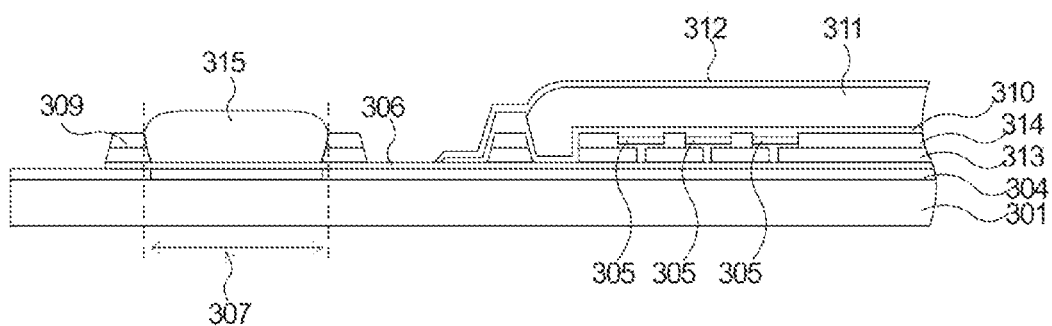
FIG. 3 is a schematic cross-section diagram taken along line A-A' of FIG. 1a according to another embodiment.

As shown in FIG. 3, a display panel provided by an embodiment of the present invention includes a flexible substrate 301, a display region defined on the flexible substrate 301, and a non-display region defined on the other side of the display region. The display region includes a TFT device layer 304, an OLED device 305, and an encapsulation layer. The encapsulation layer is a stacked layer including a first non-organic layer 310, an organic layer 311, and a second non-organic layer 312. The display region further includes a PLN layer 313, a PDL 314, and a PS layer disposed on a surface of the PDL layer 314.

The non-display region includes a sub-bending region 307. The sub-bending region 307 includes a substrate. The substrate includes a flexible substrate 301, an elastic layer 308 disposed on the flexible substrate 301, and a metal wire 306. The metal wire is disposed on the substrate. The substrate further includes an adjusting layer covering the metal wire 306.

Specifically, the adjusting layer includes a dike structure 309 formed on a surface of the sub-bending region 307 and an elastic material layer 315 formed in the dike structure 309. Material of the elastic material layer 315 is an organic material of the encapsulation layer and is formed in the dike structure 309 by inkjet printing (IJP).

A dike region of the dike structure 309 is aligned to an edge of the sub-bending region 307, and the elastic material layer 315 is aligned to an edge of the sub-bending region 307 to at least cover the sub-bending region 307 and protect the metal wire 306 in a pad bending region. On the other hand, the dike region of the dike structure 309 can also be greater than the sub-bending region 307. An area of a location covered by the elastic material layer 315 is greater than an area of the sub-bending region 307. That is, the location covered by the elastic material layer 315 expands to regions out of the sub-bending region 307. Therefore, it can protect the metal wire 306, which may be badly affected during a bending process of the sub-bending region, surrounding the sub-bending region. As a result, the metal wire 306 won't be badly affected by bending forces after the sub-bending region 307 is bent.

The dike structure 309 can be a one-piece and single-layer structure. For example, the dike structure 309 and the elastic material layer 315 can be formed simultaneously by IJP. A one-piece process can save manufacturing processes. Height of the dike structure 309 can be decided freely, which will not be limited by thicknesses of other layers. The height of the dike structure 309 can be decided by a requirement of a height of the elastic material layer 315. Furthermore, one of functional layers disposed on the metal wire 306 and disposed away from the flexible substrate 301 is patterned to form a single-layer structure, which is the dike structure 309, corresponding to a location on which the sub-bending region 307 is disposed.

The dike structure 309 can be a stacked and multi-layer structure. For example, the dike structure 309 includes a base layer, a stacked layer, and a raised layer. The base layer is formed by patterning the PLN layer 313 disposed on the TFT device layer 304, the stacked layer is formed by patterning the PDL layer 314 disposed above the TFT device layer 304, and the raised layer is formed by patterning the PS layer disposed on the PDL layer 314. Layers which forms the base layer, the stacked layer, and the raised layer can be patterned respectively, or can be patterned by the same mask process. The above base layer, stacked layer, and raised layer are formed by patterning existing layers of the display panel. Material of the elastic material layer 315 disposed in the dike structure 309 and organic material of the encapsulation layer of the display panel are the same, which reduces cost of material.

Figure 4:
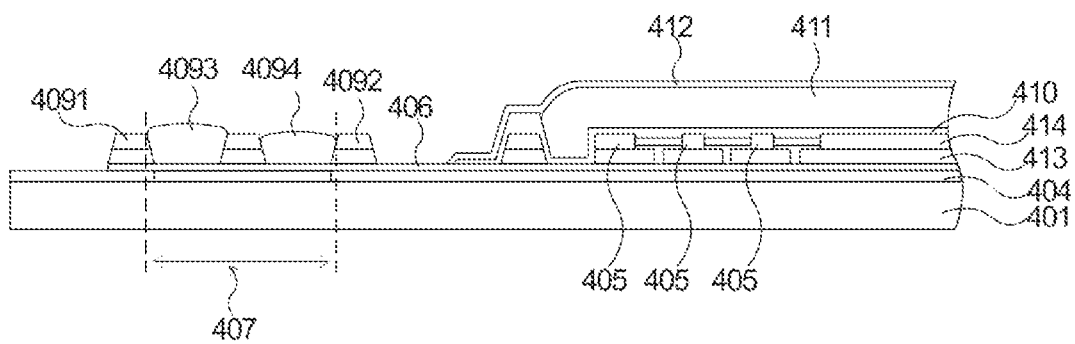
FIG. 4 is a schematic cross-section diagram taken along line A-A' of FIG. 1a according to another embodiment.

As shown in FIG. 4, a display panel provided by an embodiment of the present invention includes a flexible substrate 401, a display region defined on the flexible substrate 401, and a non-display region defined on a side of the display region. The display region includes a TFT device layer 404, an OLED device 405, and an encapsulation layer. The encapsulation layer is a stacked layer including a first non-organic layer 410, an organic layer 411, and a second non-organic layer 412. The display region further includes a PLN layer 413, a PDL layer 414, and a PS layer disposed on a surface of the PDL layer 414.

The non-display region includes a sub-bending region 407. The sub-bending region 407 includes a flexible substrate 401, an elastic layer 408 disposed on the flexible substrate 401, a metal wire 406 disposed on the elastic layer 408, a dike structure, and an elastic material layer disposed in the dike structure.

The dike structure includes at least two sub-dike structures, which will be taken as an example. The dike structure includes a first sub-dike structure 4091 and a second sub-dike structure 4092 which are connected to each other.

A first elastic material layer 4093 is disposed in the first sub-dike structure 4091, and a second elastic material layer 4094 is disposed in the second sub-dike structure 4092. The first elastic material layer 4093 and the second elastic material layer 4093 are separated by a frame of the dike structure.

The first elastic material layer 4093 and the second elastic material layer 4094 are disposed on different regions of the sub-bending region 407. Thicknesses and elastic moduli of the first elastic material layer 4093 and the second elastic material layer 4094 can be the same The thicknesses and elastic moduli of the first elastic material layer 4093 and the second elastic material layer 4094 can be determined according to bending forces applied to each region in an actual situation. For example, a fragile region of the metal wire 406 is designed to be thicker, and a strong region of the metal wire 406 is designed to be thinner. Correspondingly, heights of the first sub-dike structure 4091 and second sub-dike structure 4092 can be decided according to the thicknesses of the first elastic material layer 4093 and the second elastic material layer 4094.

A setting principle of the dike structure including at least two sub-dike structure is the same as that of the dike structure including one sub-dike structure, and will not be described here.

Figure 5:
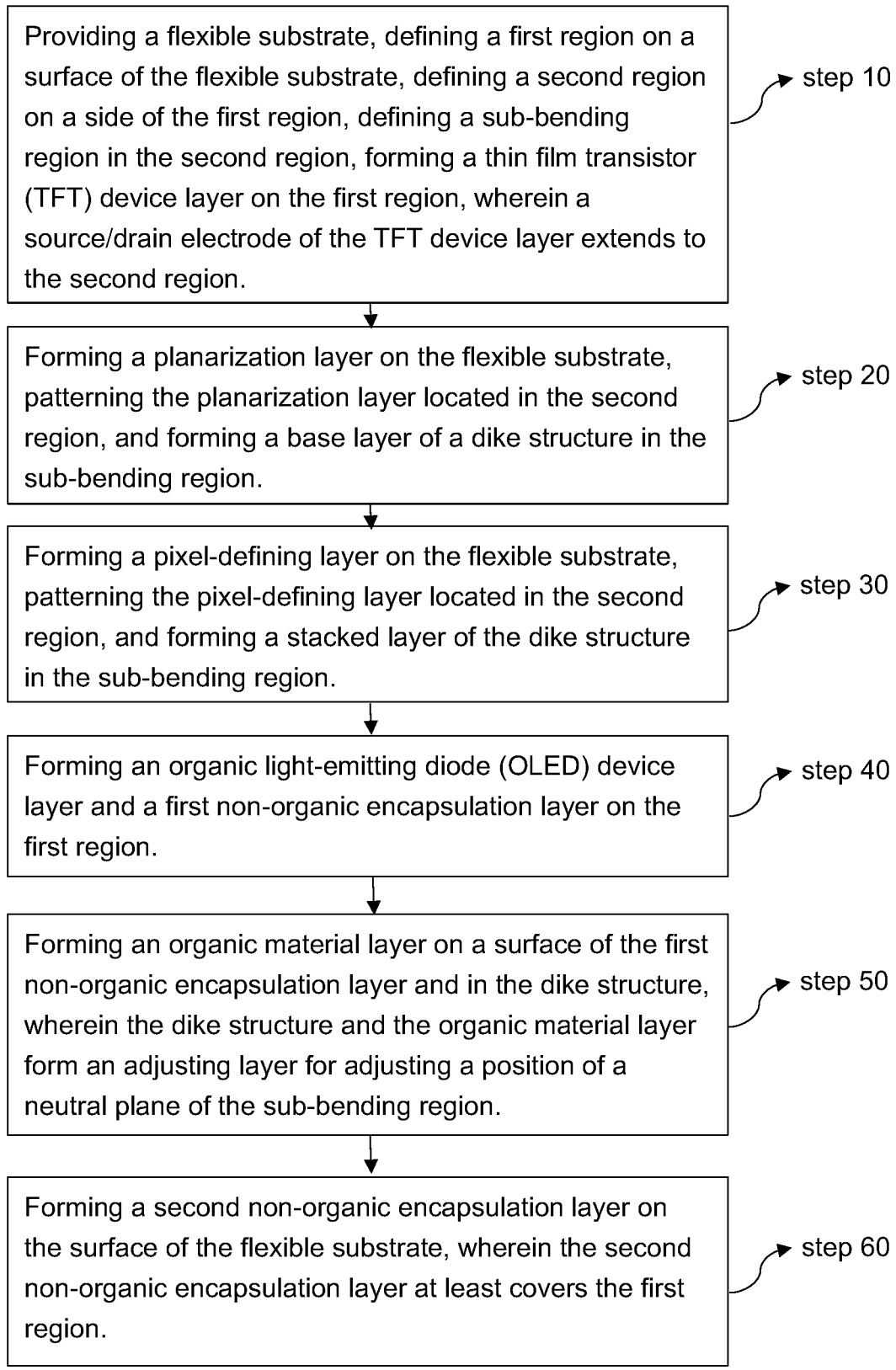
FIG. 5 is a flowchart showing a method of manufacturing a display panel provided by the present invention.

According to the above goal, the present invention provides a method of manufacturing a display panel. As shown in FIG. 5, the method includes a plurality of steps of: step 10: providing a flexible substrate, defining a first region on a surface of the flexible substrate, defining a second region on a side of the first region, defining a sub-bending region in the second region, forming a thin film transistor (TFT) device layer on the first region, wherein a source/drain electrode of the TFT device layer extends to the second region; step 20: forming a planarization layer on the flexible substrate, patterning the planarization layer located in the second region, and forming a base layer of a dike structure in the sub-bending region; step 30: forming a pixel defining layer on the flexible substrate, patterning the pixel defining layer located in the second region, and forming a stacked layer of the dike structure in the sub-bending region; step 40: forming an organic light-emitting diode (OLED) device layer and a first non-organic encapsulation layer on the first region; step 50; forming an organic material layer on a surface of the first non-organic encapsulation layer and in the dike structure, wherein the dike structure and the organic material layer form an adjusting layer for adjusting a position of a neutral plane of the sub-bending region; and step 60: forming a second non-organic encapsulation layer on the surface of the flexible substrate, wherein the second non-organic encapsulation layer at least covers the first region.

According to a preferred embodiment of the present invention, the step 10 further includes a step of: step 101: disposing an elastic layer on the second region, wherein a source/drain electrode of the TFT device layer extends to the second region and is on a surface of the elastic layer.

According to a preferred embodiment of the present invention, the step 30 further includes a step of: step 301: forming a photo spacer layer on the flexible substrate, patterning the photo spacer layer, wherein the photo spacer layer forms a plurality of spacers on the pixel defining layer, and the photo spacer layer forms a plurality of raised layers on a surface of the stacked layer of the dike structure.

Furthermore, the display panel can be manufactured by another method: step 10: providing a flexible substrate, defining a first region on a surface of the flexible substrate, defining a second region on a side of the first region, defining a sub-bending region in the second region, forming a thin film transistor (TFT) device layer on the first region, disposing an elastic layer on the second region, wherein a source/drain electrode of the TFT device layer extends to the second region and is on a surface of the elastic layer; step 20: forming a planarization layer and a pixel defining layer on the flexible substrate, and patterning the pixel defining layer located in the first region; step 30: patterning the planarization layer and the pixel defining layer located in the second region, and forming a dike structure in the sub-bending region; step 40: forming an organic light-emitting diode (OLED) device layer and a first non-organic encapsulation layer on the first region; step 50; forming an organic material layer on a surface of the first non-organic encapsulation layer and in the dike structure, wherein the dike structure and the organic material layer form an adjusting layer for adjusting a position of a neutral plane of the sub-bending region; and step 60: forming a second non-organic encapsulation layer on the surface of the flexible substrate, wherein the second non-organic encapsulation layer at least covers the first region.

Specifically, the step 20 further includes a step of: step 201; forming a photo spacer layer on the pixel defining layer, and patterning the photo spacer layer located on the first region.

The step 30 further includes a step of: step 301: patterning layers of the planarization layer, pixel defining layer, and photo spacer layer, and forming a dike structure on the sub-bending region.

In contrast to conventional technology, beneficial effects of a display panel provided by the present invention are described below: structures of stacked layers of a non-display region of the display panel are patterned. The patterned structures and a portion of an encapsulation layer form a dike structure. The dike structure is filled with an organic material layer with high elastic modulus, and the organic material layer covers a layer on which metal wires are disposed. By adjusting thicknesses and elastic moduli of the organic material layer and a layer on the other side of the metal wires, a neutral plane of a pad bending region can approach to the metal wires, thereby alleviating damage of the metal wires caused by bending forces.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A display panel, comprising:
   a display region and a non-display region;
   wherein a sub-bending region for bending is defined in the non-display region, an adjusting layer and an elastic layer are disposed on the sub-bending region, and the adjusting layer and the elastic layer are disposed oppositely on two sides of a metal wiring layer of the sub-bending region; and
   wherein the adjusting layer comprises a dike structure, and an elastic material layer is formed in the dike structure.

2. The display panel of claim 1, wherein a dike region of the dike structure is aligned to an edge of the sub-bending region, and the elastic material layer is aligned to the edge of the sub-bending region; or
   wherein an area of the dike region of the dike structure is greater than an area of the sub-bending region, and an area of a location covered by the elastic material layer is greater than the area of the sub-bending region.

3. The display panel of claim 2, wherein the dike structure is a stacked and multi-layer structure.

4. The display panel of claim 1, wherein the dike structure comprises at least two sub-dike structures, two adjacent sub-dike structures are connected to each other, and each of the two adjacent sub-dike structures comprises a corresponding sub-elastic material layer.

5. The display panel of claim 4, wherein thicknesses of the sub-elastic material layers formed in the two adjacent sub-dike structures are the same, and elastic moduli of the sub-elastic material layers formed in the two adjacent sub-dike structures are the same.

6. The display panel of claim 1, wherein material of the dike structure is at least one selected from the group consisting of material of a planarization layer, material of a pixel defining layer, and material of photo spacer layer; and
wherein material of the elastic material layer is an organic material of an organic encapsulation layer.

7. A display panel, comprising:
a display region and a non-display region;
wherein a sub-bending region for bending is defined in the non-display region, and an adjusting layer and an elastic layer are disposed on the sub-bending region; and
wherein the adjusting layer comprises a dike structure, and an elastic material layer is formed in the dike structure.

8. The display panel of claim 7, wherein a dike region of the dike structure is aligned to an edge of the sub-bending region, and the elastic material layer is aligned to the edge of the sub-bending region; or
wherein an area of the dike region of the dike structure is greater than an area of the sub-bending region, and an area of a location covered by the elastic material layer is greater than the area of the sub-bending region.

9. The display panel of claim 8, wherein the dike structure is a stacked and multi-layer structure.

10. The display panel of claim 7, wherein the dike structure comprises at least two sub-dike structures, two adjacent sub-dike structures are connected to each other, and each of the two adjacent sub-dike structures comprises a corresponding sub-elastic material layer.

11. The display panel of claim 10, wherein thicknesses of the sub-elastic material layers formed in the two adjacent sub-dike structures are the same, and elastic moduli of the sub-elastic material layers formed in the two adjacent sub-dike structures are the same.

12. The display panel of claim 7, wherein material of the dike structure is selected from the group consisting of material of a planarization layer, material of a pixel defining layer, material of a photo spacer layer, and combinations thereof; and
wherein material of the elastic material layer is an organic material of an organic encapsulation layer.

* * * * *